(12) United States Patent
Gershfeld et al.

(10) Patent No.: US 7,383,413 B2
(45) Date of Patent: Jun. 3, 2008

(54) CARD-CAGE AUDIO VISUAL SIGNAL CONTROL SYSTEM WITH CARD ID ASSIGNMENT

(76) Inventors: Jack Gershfeld, 615 Del Rio Way, Fullerton, CA (US) 92835; Xen Van Tran, 13702 Purdy St., Garden Grove, CA (US) 92844; Olga Alayev, 2404 N. Creel La., Fullerton, CA (US) 92831

( * ) Notice: Subject to any disclaimer, the term of this patent is extended or adjusted under 35 U.S.C. 154(b) by 102 days.

(21) Appl. No.: 11/273,841

(22) Filed: Nov. 16, 2005

(65) Prior Publication Data

US 2007/0109150 A1     May 17, 2007

(51) Int. Cl.
*G06F 9/34*     (2006.01)
(52) U.S. Cl. ................. 711/200; 710/8; 710/9
(58) Field of Classification Search .......... 710/8, 710/9; 711/4, 200
See application file for complete search history.

(56) References Cited

U.S. PATENT DOCUMENTS

| | | | | |
|---|---|---|---|---|
| 5,826,103 A | * | 10/1998 | Whittaker | ................. 710/8 |
| 5,918,241 A | * | 6/1999 | Egy | ........................ 711/4 |
| 6,735,636 B1 | * | 5/2004 | Mokryn et al. | ............. 710/5 |
| 6,886,171 B2 | * | 4/2005 | MacLeod | ................. 719/324 |
| 7,213,126 B1 | * | 5/2007 | Smaus et al. | ............ 711/217 |
| 2006/0059325 A1 | * | 3/2006 | Milne et al. | ............. 711/200 |
| 2006/0294338 A1 | * | 12/2006 | Fisher et al. | ............. 711/200 |

\* cited by examiner

*Primary Examiner*—Timothy Edwards, Jr.
(74) *Attorney, Agent, or Firm*—Vladimir Khiterer

(57) ABSTRACT

A card-cage audio visual signal control system with card ID assignment is disclosed. Cards are removably installed in slots inside a cage enclosure, each card performing a specific function with respect to audio visual signals applied to the card. Card IDs are used to communicate with the cards. Card IDs alternate between physical and logical addresses for each card, thus allowing the cards to be moved from slot to slot inside the cage enclosure without having to reprogram the card-cage audio visual signal control system every time a card is so moved.

1 Claim, 2 Drawing Sheets

CARD-CAGE AUDIO VISUAL SIGNAL CONTROL SYSTEM WITH CARD ID ASSIGNMENT

BACKGROUND OF THE INVENTION

The present invention pertains to a card-cage audio visual signal control system with card ID assignment. Conventionally, the core of many audio/visual presentation systems has been made up of a collection of several different stand-alone products, each accomplishing a particular function. A better approach to managing signals is using a modular card-cage solution that permits distribution, switching, matrix switching, and signal conversion in one comprehensive rack-based system. A modular card-cage solution provides the following advantages over a collection of several different stand-alone products:

(1) Flexibility: A modular card-cage solution enables the user to adapt to changes quickly. For example, if a system requires a composite video switcher one day and an S-Video switcher the next, the user can just add another card.
(2) Expandability: To expand the capabilities of the existing modular card-cage signal management system, the user can simply add more cards. Once all of the card slots are filled in a single cage, the user can add an additional cage and loop the RS-232 control.
(3) Space reduction: By eliminating redundant elements, more can be accomplished in a smaller space, using one RS-232 connection and one power connector. This is crucial for portable systems and crowded racks.
(4) Training reduction: Once the user is familiar with operating and programming a few cards in the modular card-cage signal management system, the user will adapt quickly to new cards that are introduced.
(5) Future proofing: With the modular card-cage signal management system, the user can keep the cards for the signal formats that remain common in the industry, and switch out the ones that don't for newer cards developed to meet industry trends.

DESCRIPTION OF THE PRIOR ART

In order to properly program, configure, maintain and troubleshoot a card cage system, it is necessary to provide a card identification (the "card ID"). The card ID is used to address the card, control the parameters of the card, query the card status and ascertain any other information about the card.

Conventionally, the cage enclosure has a bus comprising interface connectors where cards are plugged in. Each interface connector has a number of pins that are configured in such a way as to assign a unique binary number to each card plugged in the interface connector. Depending on the number of slots in the cage enclosure, such binary number can be from 1 to 40, or more. As such, the hard coded information is used to assign an ID number to each card, based on the slot number it is installed in. This is known as a "physical address" of the card.

When the card is plugged in, the microprocessor reads the hard coded physical address (i.e. the slot number) of the card and assigns the corresponding binary number as the card ID. Once the card ID is assigned, it is later used to address the card and to communicate with the card for setting parameters or reading feedback.

The advantage of this method is that the card ID is assigned automatically and it is always the same as the slot number where the card is plugged in. The disadvantage of this method is that once the unit us programmed and control software is complete, moving cards from one slot to anther within the unit will render the software program obsolete. This is because the software will not recognize that a particular card has been moved to a new slot. What is needed, therefore, is a card-cage audio visual signal control system in which a card ID can be assigned to any card on a permanent basis and remain the same regardless of moving the card to a different slot, while retaining the advantages of automatically assigning card IDs based on the slot number where the card is plugged in.

SUMMARY OF THE INVENTION

The card-cage audio visual signal control system with card ID assignment according to this invention satisfies this need. It has a cage enclosure comprising a plurality of slots disposed inside the cage enclosure. There is also a bus disposed inside the cage enclosure. The bus is coupled to the slots. Various cards are removably installed into the slots (the cards actually slide in and out), each card performing a specific function with respect to signals applied to the card. Each slot defines a physical address for the card installed therein based on the slot location on the bus.

The cage enclosure houses a processor coupled to the bus. The processor comprises a memory and controls the cards through a unique card ID assigned to each card. There is a power means disposed inside the cage enclosure that supplies power to the processor and the cards. The card ID alternates between the physical address and a logical address.

To assign a logical address as the card ID, the user installs the card into any of the slots, applies power to the card and sends a command to the processor to assign the logical address to the card. The processor, in response to such a command by the user, generates the logical address and assigns the logical address as the card ID. The processor then stores the logical address as the card ID in the memory.

To alternate between the physical address and the logical address, the user installs the card into any of the slots and applies power to the card. The processor then accesses the memory to locate the logical address for the card stored in the memory. If the processor locates the logical address for the card stored in the memory, it ignores the physical address for the card and assigns the logical address as the card ID. If the processor does not locate the logical address for the card stored in the memory, it reads the physical address for the card from the bus and assigns the physical address as the card ID.

BRIEF DESCRIPTION OF THE DRAWINGS FIGURES

DETAILED DESCRIPTION OF THE PREFERRED EMBODIMENT

Figure 1:
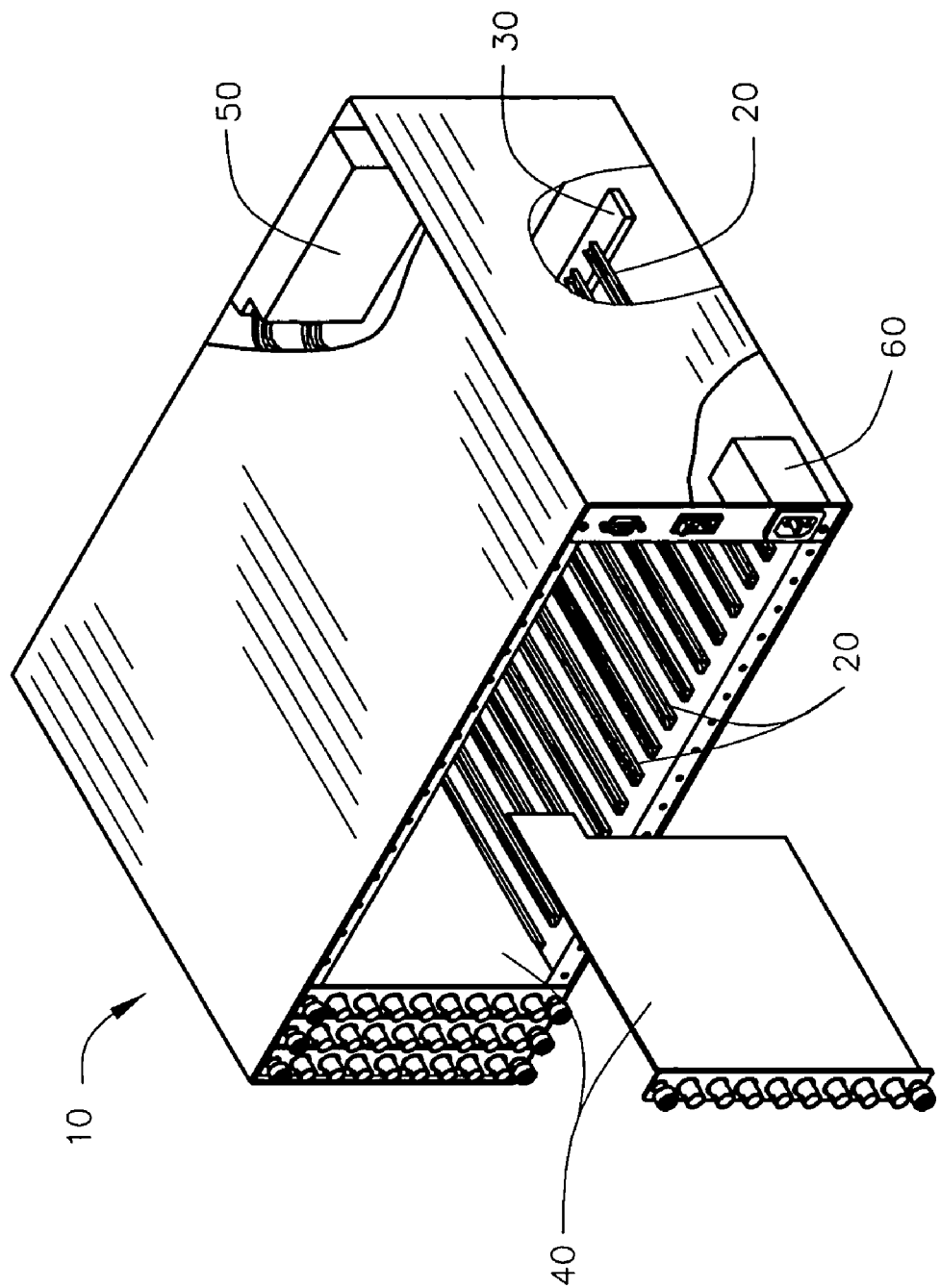
FIG. 1 shows an exploded isometric view of a card-cage audio visual signal control system with card ID assignment according to the present invention.
Figure 2:
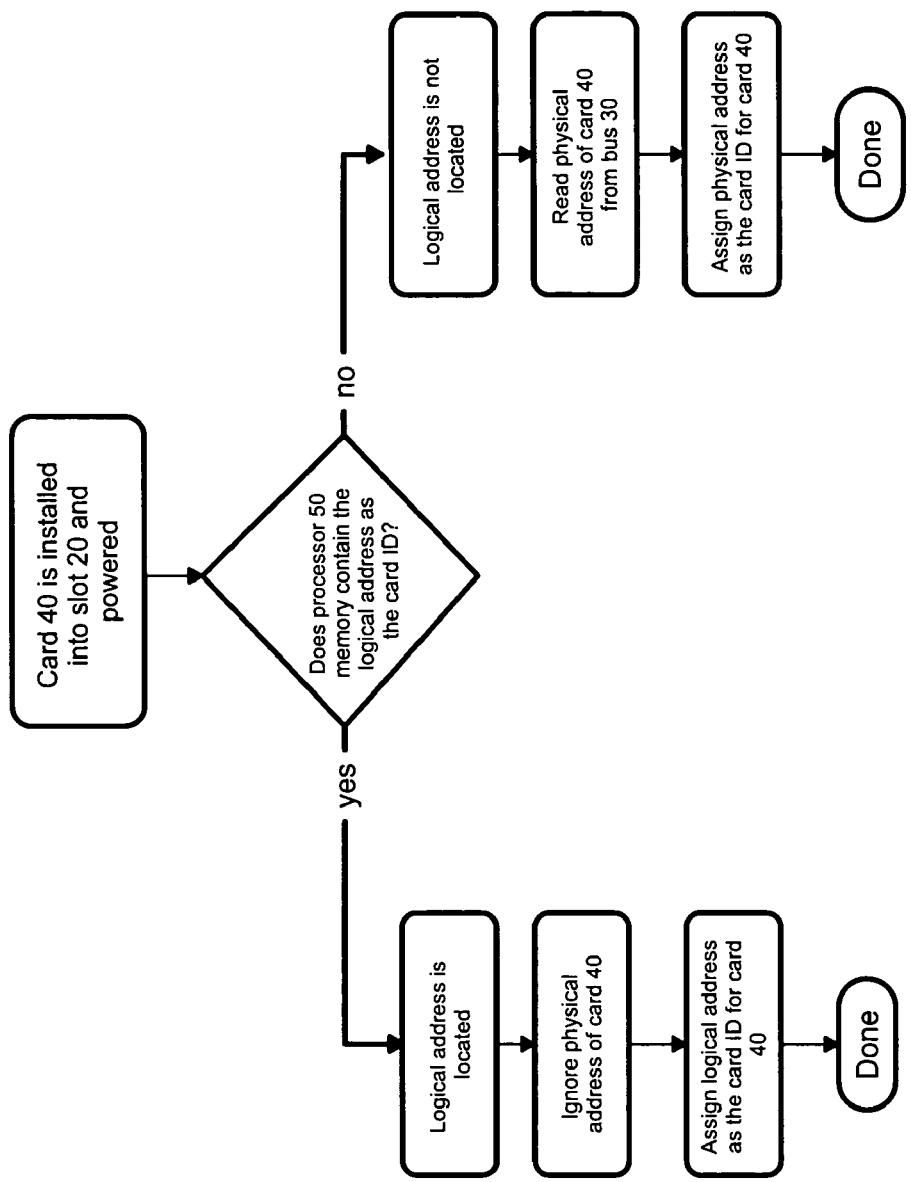
FIG. 2 shows a block diagram illustrating the method of alternating between a logical and physical addresses for card IDs according to the present invention.

This invention will be better understood with the reference to the drawing figures FIG. 1 and FIG. 2.

Viewing FIG. 1, numeral 10 indicates a cage enclosure. Cage enclosure 10 comprises a plurality of slots disposed inside cage enclosure 10, indicated by numeral 20. Numeral 30 indicates a bus. Bus 30 is disposed inside cage enclosure 10. Bus 30 is coupled to slots 20.

Numeral 40 indicates a card. A plurality of cards 40 are removably installed into slots 20. Each card 40 performs a specific function with respect to signals applied to the card. For example, each card 40 can be either a distribution amplifier, switcher, matrix switcher or perform a variety of other functions related to conversion, distribution and manipulation of audio visual signals. It should be noted that FIG. 1 shows tightening screws on Cards 40 and the corresponding openings for receiving the tightening screws on Cage 10 for securing Cards 40 in Slots 20. However, Cards 40 can be secured in Slots 20 by any means known to the persons knowledgeable in the pertinent arts. Each slot 20 defines a physical address for cards 40 installed therein based on the slot location on bus 30.

a processor disposed inside the cage enclosure, the processor coupled to the bus, the Numeral 50 indicates a processor. Processor 50 comprises a memory and controls cards 40 through a unique card ID assigned to each card 40. Said card ID alternates between the physical address and a logical address.

Numeral 60 indicates a power means. Power means 60 is disposed inside cage enclosure 10 and supplies power to processor 50 and cards 40.

In order to assign a logical address as the card ID, the user installs card 40 into any of the slots 20, applies power to card 40 and sends a command to processor 50 to assign the logical address to card 40. Processor 50, in response to such a command by the user, generates the logical address and assigns the logical address as the card ID. Processor 50 then stores the logical address as the card ID in the memory.

Viewing now FIG. 2, there is shown a block diagram illustrating the method of alternating between a logical and physical addresses for card IDs. Specifically, in order to alternate between the physical address and the logical address, the user installs card 40 into any of the slots 20 and applies power to the card. Processor 50 then accesses the memory to locate the logical address for card 40 stored in the memory. If processor 50 locates the logical address for card 40 stored in the memory, it ignores the physical address for card 40 and assigns the logical address as the card ID. If processor 50 does not locate the logical address for card 40 stored in the memory, it reads the physical address for card 40 from bus 30 (based on the location of slot 20 on bus 30) and assigns the physical address as the card ID. This allows the advantage of a card ID being assigned to any card 40 on a permanent basis by way of a logical address and remain the same regardless of moving card 40 to a different slot 20, while retaining the advantages of automatically assigning card IDs based on slot 20 number where card 40 is plugged in.

While the present invention has been described and defined by reference to the preferred embodiment of the invention, such reference does not imply a limitation on the invention, and no such limitation is to be inferred. The invention is capable of considerable modification, alteration, and equivalents in form and function, as will occur to those ordinarily skilled and knowledgeable in the pertinent arts. The depicted and described preferred embodiment of the invention is exemplary only, and is not exhaustive of the scope of the invention. Consequently, the invention is intended to be limited only by the spirit and scope of the appended claims, giving full cognizance to equivalents in all respects.

What is claimed is:

1. A card-cage audio visual signal control system with card ID assignment comprising:
   (1) a cage enclosure comprising a plurality of slots disposed inside the cage enclosure;
   (2) a bus disposed inside the cage enclosure, the bus coupled to the slots;
   (3) a plurality of cards removably installed into the slots, each card performing a specific function with respect to signals applied to the card, each slot defining a physical address for the card installed therein based on the slot location on the bus;
   (4) a processor disposed inside the cage enclosure, the processor coupled to the bus, the processor comprising a memory, wherein the processor controlling the cards through a unique card ID assigned to each card, the card ID alternating between the physical address and a logical address;
   (5) a power means disposed inside the cage enclosure, the power means supplying power to the processor and the cards;
   wherein the logical address as the card ID is assigned by a method comprising:
     installing the card into any of the slots;
     applying power to the card;
     under control of a user, sending a command to the processor to assign a logical address to the card;
     under control of the processor, in response to the command by the user to assign a logical address to the card, generating the logical address and assigning the logical address as the card ID;
     under control of the processor, storing the logical address as the card ID in the memory;
   wherein alternating between the physical address and the logical address is performed a method comprising:
     installing the card into any of the slots;
     applying power to the card;
     under control of the processor, accessing the memory to locate the logical address for the card stored in the memory;
     under control of the processor, in response to locating the logical address for the card stored in the memory, ignoring the physical address for the card and assigning the logical address as the card ID;
     under control of the processor, in response to locating no logical address for the card stored in the memory, reading the physical address for the card from the bus and assigning the physical address as the card ID, wherein the physical address for the card is never stored in the memory but rather changes each time the card is moved from slot to slot, while the logical address does not change.

* * * * *